Feb. 2, 1971 I. A. LESK 3,559,282

METHOD FOR MAKING THIN SEMICONDUCTOR DICE

Original Filed April 25, 1967

INVENTOR.
Israel Arnold Lesk

Mueller Aichele + Rauner
ATTYS.

United States Patent Office 3,559,282

Patented Feb. 2, 1971

3,559,282

METHOD FOR MAKING THIN SEMICONDUCTOR DICE

Israel A. Lesk, Scottsdale, Ariz., assignor to Motorola, Inc., Franklin Park, Ill., a corporation of Illinois Original application Apr. 25, 1967, Ser. No. 633,631, now Patent No. 3,445,925, dated May 27, 1969. Divided and this application Sept. 3, 1968, Ser. No. 798,209

Int. Cl. B01j *17/00;* H01l *1/16, 1/24, 7/68*

U.S. Cl. 29—577 3 Claims

ABSTRACT OF THE DISCLOSURE

A process for making thin semiconductor devices wherein the semiconductor wafer starting material is initially lapped to a very thin value. Glass and a dummy substrate are then sandwiched to the wafer for further processing and to prevent breakage of the wafer when semiconductor devices such as transistors are constructed therein. Then the glass and dummy substrate are removed, leaving thin semiconductor dice having a very low thermal resistance to heat emanating from PN junctions therein.

This application is a divisional application of Ser. No. 633,631, filed Apr. 25, 1967, now Pat. 3,445,925, May 27, 1969 and assigned to the present assignee.

This invention relates generally to methods for manufacturing semiconductor devices and more particularly to a process for making very thin semiconductor devices which have a low thermal resistance.

There is a certain amount of heat generated by a PN junction within a semiconductor device, and this heat is dissipated by conduction through the P or N type semiconductor material of the device and to the header upon which is mounted. For linear heat conduction, the rate of heat flow may be expressed as $$\frac{dQ}{dt}=\frac{KA}{L}\Delta T$$

where

Q=quantity of heat (energy), K=thermal conductivity,
A/L=area-to length ratio of the specimen through which the heat is flowing, and
$\Delta T$=temperature difference over the length L.

Therefore, by reducing the thickness L of a semiconductor wafer (from which the semiconductor device is made) as much as is practical with present manufacturing techniques before cutting the wafer into dice and mounting the dice on headers, the rate of heat flow through the dice may be substantially increased.

In an early phase of semiconductor wafer processing, it has been a common prior art practice to lap the wafers in order to reduce the thickness and the thermal resistance thereof. However, if the wafers are reduced in thickness below 6–8 mils and then further processed to form transistors, diodes and the like, high yields in the further processing steps are difficult to obtain. When the wafer thickness is ground or lapped below 6–8 mils, excessive breakage of portions of the wafer occurs during subsequent processing and makes uneconomical and impractical any effort to further reduce the wafer thickness.

SUMMARY OF THE INVENTION

An object of this invention is to provide an improved process for making very thin semiconductor dice at high yields.

Another object of this invention is to provide an improved process for manufacturing semiconductor devices which have a low thermal resistance.

Briefly described, the present invention is embodied in a process wherein a semiconductor wafer is first ground to a very thin value, e.g., ½ mil. A layer of molten glass is then sandwiched between the thin wafer and a dummy substrate for supporting the wafer and protecting same against breakage when transistors and other semiconductor devices are constructed in the wafer. After semiconductor devices have been constructed in the wafer, metallization may be deposited on the surface thereof for making electrical contact to the semiconductor devices constructed in the wafer. Thereafter, the layer of glass is etched away and the dummy substrate is simultaneously removed therewith. The wafer is then cut into dice and the thin dice are mounted on a header in accordance with known manufacturing techniques. The resulting semicoductor products include dice that are in the order of ½ mil thickness rather than 6 to 8 mils as were the prior art dice.

DESCRIPTION OF THE INVENTION

Figure 1:
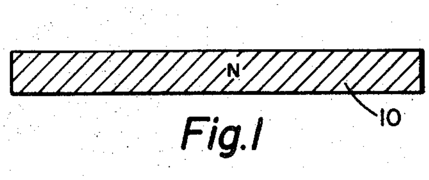
FIGS. 1 through 6 illustrate respectively a sequence of steps in processing a silicon wafer and building devices in same in accordance with the present invention.
Figure 2:
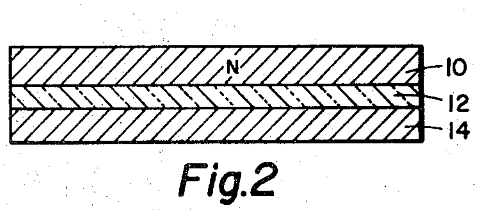
Figure 3:
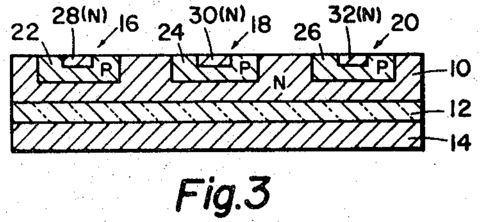

Referring to the drawings, there is shown in FIG. 1 a silicon wafer 10 which is initially lapped to a thickness in the order of ½ mil. As seen in FIG. 2 a layer of molten glass 12 is sandwiched between the silicon wafer 10 and a silicon dummy substrate 14 and the glass layer 12 is allowed to cool until becoming firmly bonded to both the silicon wafer 10 and the dummy substrate 14. One glass which has been used successfully in the process according to this invention is "EE5" sold commercially by the Kimble Glass Company.

Preferably, a glass having thermal expansion characteristic substantially the same as those of the semiconductor wafter 10 should be used to bond the wafter 10 to the dummy substrate 14, and the term "glass" as used herein is intended to include various vitreous materials including glassy oxides and ceramics. One process which may be used in the alternative to form the glass layer 12 rather than to use "EE5" is to mix a volatile diluent such as glycerol or a glycol with a finely divided glass powder. The glass powder may be a silicate glass formed from a major portion of silicon dioxide and a minor portion of aluminum oxide. Glasses which also include quantities of one or more of the alkaline earth metal oxides such as barium, calcium and magnesium oxides may also be used.

The glass mixture is simultaneously applied to the surface of the substrate 14 as well as to a surface of the semiconductor wafer 10 and the wafer 10 and the substrate 14 are initially heated to vaporize and remove the diluent. Next the glass layer 12, the silicon wafer 10 and the silicon dummy substrate 14 are heated to at least 1000° C. in an oxygen-containing atmosphere to facilitate fusion of the glass with the silicon wafer 10 and dummy substrate 14. Preferably a fusion temperature in the range between 1200° C. and 1400° C. is used. The time required to accomplish the fusion of the glass will depend, to a large extent, upon the particular glass composition employed, and generally this time will be less than about 45 minutes and preferably between 10 and 30 minutes.

Upon completion of the glass fusion step, the structure shown in FIG. 2 is removed from the heating chamber of a furnace and permitted to cool at room temperature.

A passivating layer of silicon oxide (not shown) is grown on the surface of the wafer 10 and retained thereon with a material such as wax throughout the processes illustrated in FIGS. 2–6 and FIGS. 9–13. This oxide layer is used to passivate the PN junctions at their points of surface termination and prevents shorting of the junctions by a layer of metallization which is used to make electrical contact to the PN devices. However steps of forming protective oxide coatings together with masking, photoresist and etching steps are well known in the art and have been omitted in the drawing for the sake of simplicity.

Once the layer of glass 12 has cooled and is firmly bonded to the wafer 10 and to the dummy substrate 14, a plurality of PN devices such as transistors 16, 18 and 20 are constructed in the surface regions of the wafer 10. These devices include typically P type base regions 22, 24 and 26, N type emitter regions 28, 30 and 32, and the wafer 10 serves as a common collector region. Semiconductor devices such as transistors 16, 18 and 20 are constructed using well known photolithographic techniques, i.e., solid state diffusion, masking, etching, etc. These techniques are well known to those skilled in the art of integrated circuit construction.

Figure 5:
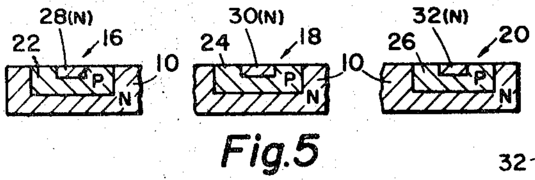
Figure 6:
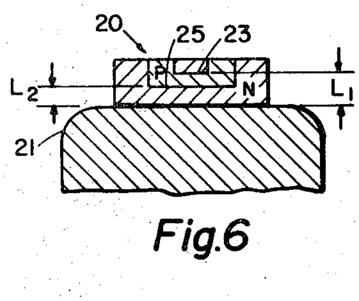
Figure 7:
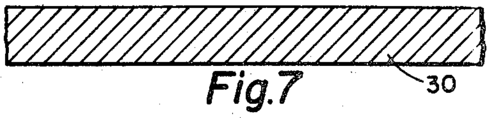
FIGS. 7 through 13 illustrate another process according to this invention in which devices are constructed in the silicon wafer and a metal-over-oxide coating is applied thereto.

After the transistors 16, 18 and 20 or other semiconductor devices (not shown) have been formed in the ½ mil thick wafer 10, the glass layer 12 is etched away using a glass etchant. One glass etchant which has been used successfully to etch away the glass layer 12 of "EE5" is hydrofluoric acid, HF. The silicon dummy substrate 14 will automatically fall off as the glass layer 12 is removed. Next, the devices 16, 18 and 20 may be separated as shown in FIG. 5 using scribing techniques, and the separate devices in FIG. 5 may be thereafter mounted on individual headers as illustrated in FIG. 6. In the die 20 shown in FIG. 6, the heat generated at the PN junctions 23 and 25 must travel only lengths $L_1$ and $L_2$ respectively to the surface of the header 21, and $L_1$ and $L_2$ are typically in the order of a few microns.

Figure 4:
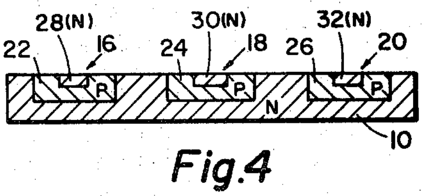

For a particular integrated circuit application it may be preferred not to scribe the wafer shown in FIG. 4 into individual semiconductor devices as shown in FIG. 5. The structure in FIG. 4 can be further processed using standard metal-over-oxide techniques, and the common N type region of the wafer 10 can be reverse biased with respect to adjacent P type regions using the well known PN junction isolation. Additional diffusions (not shown) can be made in the wafer shown in FIG. 3 if the lower N type region in FIG. 4 is to serve only as an isolation region.

The process illustrated in FIGS. 7 through 13 is similar to that described above with reference to FIGS. 1 through 6 in that a layer of glass 32 and a silicon dummy substrate 34 are used for mechanical support purposes.

Figure 8:
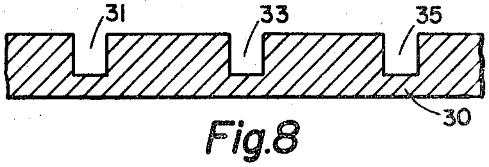
Figure 9:
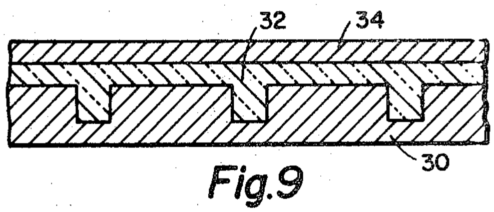
Figure 10:
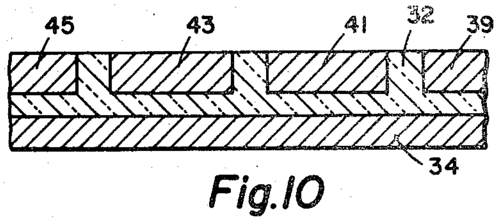
Figure 11:
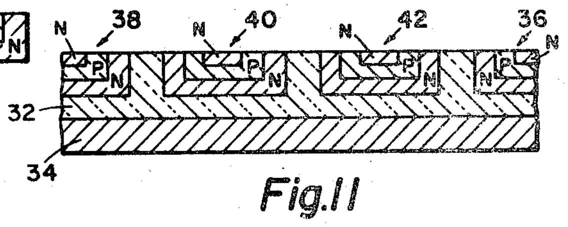

Using known masking techniques, slots 31, 33 and 35 are etched in a silicon wafer 30 to form the structure shown in FIG. 8. Thereafter, a layer of molten glass 32 is sandwiched between the etched wafer 30 and a silicon dummy substrate 34 as shown in FIG. 9 and then allowed to cool until the dummy substrate 34 and silicon wafer 30 are firmly bonded to the glass. Subsequently, the structure in FIG. 9 is flipped over and the surface region 37 thereof is lapped away to produce the resultant structure shown in FIG. 10. The regions 39, 41, 43 and 45 in FIG. 10 are isolated by columns of glass in the slots 31, 33 and 35 (see FIG. 8).

Semiconductor devices such as NPN transistors 36, 38, 40 and 42 are thereafter constructed (FIG. 11) in the isolated regions 39, 41, 43 and 45 using known processing techniques, i.e., double diffusion, oxide growing, photoresist, masking and etching steps.

Figure 12:
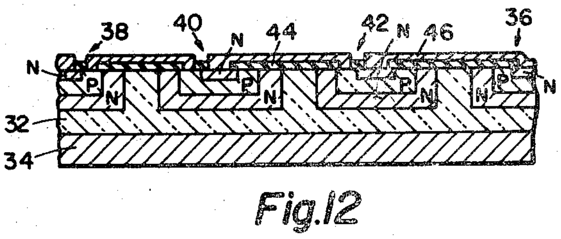

FIG. 12 illustrates a structure in which the NPN transistors 36, 38, 40 and 42 have been joined by a layer of metallization 46 which has been deposited on a silicon dioxide coating 44 in accordance with known metal overlay technology. The oxide coating 44 passivates the PN junctions of the transistors at their respective points of surface termination, and the metallization 46 provides electrical interconnection to the individual NPN transistors in FIG. 12. The layer of glass 32 is etched away as described above the dummy substrate 34 is removed simultaneously therewith, leaving the structure shown in FIG. 13.

Figure 13:
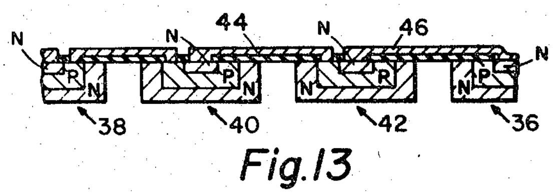

If desired, the NPN transistors in FIG. 13 may be used in a particular integrated circuit application, joined and maintained in their respective positions by the beams of metallization which make electrical contact to the individual transistors.

An alternative to the above-described process is to scribe through the layer of metallization 46 and the underlaying oxide coating 44 and thereafter use the NPN transistors for separate applications.

Thus, the present invention is embodied in a novel process for making extremely thin PN junction devices which present a very low thermal resistance to the heat generated at the PN junctions within the devices. Accordingly, the heat dissipated in a semiconductor die during device operation is maintained at an absolute minimum.

I claim:

1. A process for manufacturing a plurality of individual thin semiconductor devices from a wafer of semiconductor material which comprises:

(a) lapping the semiconductor wafer to obtain a thickness in the order of ½ mil;

(b) etching slots in said wafer;

(c) applying a layer of molten glass to said wafer;

(d) sandwiching said glass layer between a dummy substrate and said wafer;

(e) allowing said molten glass layer to cool and become firmly bonded to said wafer and to said dummy substrate, the glass layer and dummy substrate providing mechanical support for said wafer during further processing thereof;

(f) lapping away the unetched side of said wafer at least to the depth of said slots to form separate regions in the remaining portion of said wafer, said regions being dielectrically isolated from each other by the glass layer;

(g) constructing semiconductor devices having PN junctions in the separate regions of said wafer;

(h) forming a passivating layer for the PN junctions of said semiconductor devices;

(i) forming metal overlay contacts on the semiconductor devices;

(j) removing the layer of glass and simultaneously removing the dummy substrate to form a plurality of individual thin semiconductor devices.

2. The process of claim 1 further including the step of mounting the individual semiconductor devices on headers, the distance between a header and the PN junctions of the device mounted thereon being very small whereby a low thermal resistance is obtained for heat generated in said PN junctions.

3. The process of claim 1 wherein the steps of forming a passivating layer and metal overlay contacts include forming the passivating layer so that it extends between adjacent devices and forming the metal overlay contacts so that a plurality of individual devices are electrically interconnected by a metal-over-passivating layer coating, said coating maintaining the semiconductor devices in the relative positions when the glass layer and dummy substrate are subsequently removed.

References Cited

UNITED STATES PATENTS

| | | | |
|---|---|---|---|
| 2,984,897 | 5/1961 | Godfrey | 29—424 |
| 3,290,753 | 12/1966 | Chang | 29—25.3 |
| 3,307,239 | 3/1967 | Lepselter et al. | 29—591 |
| 3,432,919 | 3/1969 | Rosvold | 29—589X |
| 3,445,925 | 5/1969 | Lesk | 29—577 |
| 3,461,548 | 8/1969 | Schutze et al. | 29—590X |
| 3,475,664 | 10/1969 | DeVries | 29—578X |

JOHN F. CAMPBELL, Primary Examiner

R. B. LAZARUS, Assistant Examiner

U.S. Cl. X.R.

29—580, 583, 589